(12) United States Patent
Goebel et al.

(10) Patent No.: US 8,367,514 B2
(45) Date of Patent: Feb. 5, 2013

(54) INTEGRATED CIRCUIT WITH CAPACITOR AND METHOD FOR THE PRODUCTION THEREOF

(75) Inventors: Thomas Goebel, München (DE); Johann Helneder, Landsham (DE); Heinrich Körner, Bruckmühl (DE); Andrea Mitchell, München (DE); Markus Schwerd, Holzkirchen (DE); Martin Seck, München (DE); Holger Torwesten, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 180 days.

(21) Appl. No.: 12/696,811

(22) Filed: Jan. 29, 2010

(65) Prior Publication Data

US 2010/0129977 A1  May 27, 2010

Related U.S. Application Data

(60) Division of application No. 11/368,254, filed on Mar. 3, 2006, now Pat. No. 7,692,266, which is a continuation of application No. PCT/EP2004/051570, filed on Jul. 21, 2004.

(30) Foreign Application Priority Data

Sep. 5, 2003 (DE) .................................. 103 41 059

(51) Int. Cl.
*H01L 21/302* (2006.01)
(52) U.S. Cl. ................................ 438/396; 257/E21.011
(58) Field of Classification Search .................. 438/396, 438/399; 257/E21.011
See application file for complete search history.

(56) References Cited

U.S. PATENT DOCUMENTS

| 3,988,824 | A | * | 11/1976 | Bodway | ........................ 216/16 |
| 4,450,048 | A | | 5/1984 | Gaulier | |
| 6,383,859 | B2 | * | 5/2002 | Watanabe | ..................... 438/239 |
| 6,445,027 | B2 | * | 9/2002 | Adachi | ........................ 257/300 |
| 2004/0072406 | A1 | * | 4/2004 | Ng et al. | ....................... 438/396 |

* cited by examiner

*Primary Examiner* — Wensing Kuo
(74) *Attorney, Agent, or Firm* — Infineon Techn. AG; Philip Schlazer

(57) ABSTRACT

An integrated circuit and fabrication method are presented. The integrated circuit includes a capacitor containing a base electrode, a covering electrode, and a dielectric between the base and covering electrodes. The dielectric contains an oxide of a material contained in the base electrode, which may be produced by anodic oxidation. A peripheral edge of the dielectric is uncovered by the covering electrode. A base layer on the capacitor includes a cutout adjacent to the dielectric. During fabrication, the base layer protects the material of the base electrode that is to be anodically oxidized from chemicals, and also protects the surrounding regions from anodic oxidation. A precision resistor may be fabricated simultaneously with the capacitor.

4 Claims, 2 Drawing Sheets

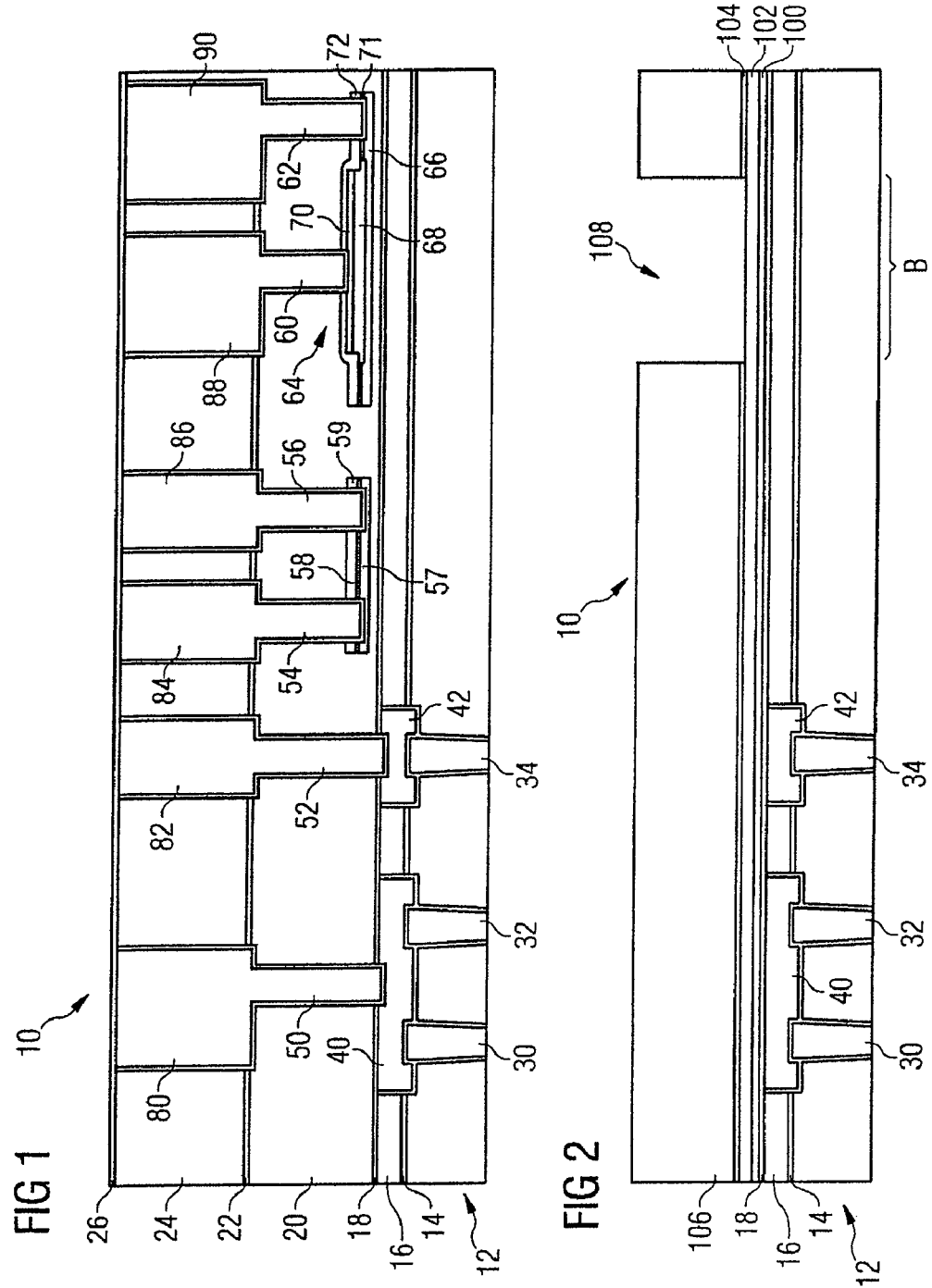

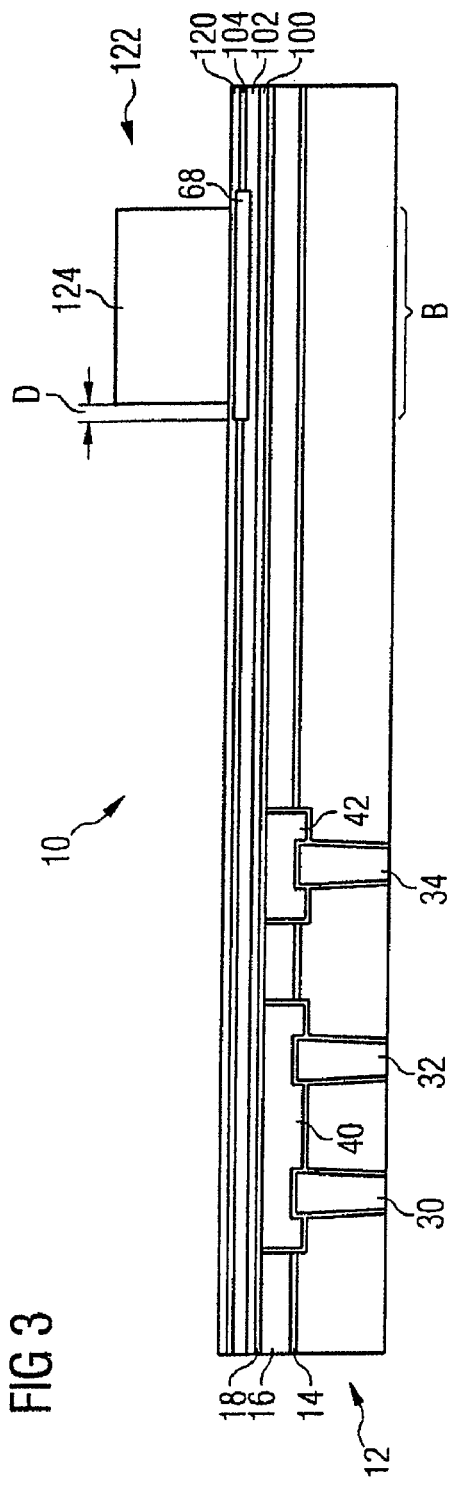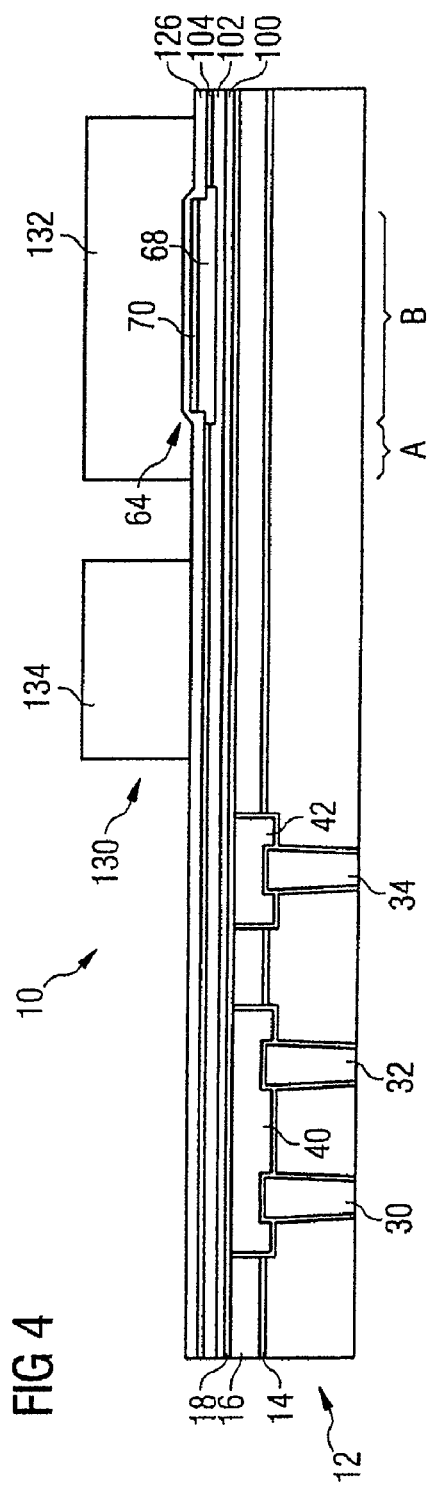

INTEGRATED CIRCUIT WITH CAPACITOR AND METHOD FOR THE PRODUCTION THEREOF

PRIORITY CLAIM

This application is a divisional of U.S. patent application Ser. No. 11/368,254 filed on Mar. 3, 2006 now U.S. Pat. No. 7,692,266, which was a continuation of international application PCT/EP2004/051570 filed on Jul. 21, 2004, which claims priority to German Patent Application DE 103 41 059.7, filed on Sep. 5, 2003, all of which are incorporated by reference in their entirety.

TECHNICAL FIELD

The present invention relates to an integrated circuit. More specifically, the present invention relates to an integrated circuit having a capacitor having a valve metal base electrode, a dielectric, and a covering electrode.

BACKGROUND

The use of integrated circuits in electronic devices has steadily increased in recent years. Integrated circuits contain a variety of electronic components which may include capacitors, resistors, transistors and other devices. The integrated circuits are fabricated in a substrate using complex fabrication processes that use an extensive amount of time and labor.

Many problems may exist during fabrication of capacitors in the integrated circuit. For example, metals used to form the underlying electrode on which a dielectric is grown react with a large number of chemical substances used in the fabrication processes (e.g. with the liquid or solid material of a resist layer, in particular a photoresist, or with liquids which are used to develop a resist layer). Additionally, the growth of a high quality dielectric, i.e. having low leakage currents, is dependent on whether the surface of the metal has not yet reacted with resist or developer.

Other problems with capacitor fabrication in integrated circuits include incomplete patterning of the dielectric and/or electrodes, inability in controlling the dielectric thickness, or formation of polymers on the sides of the dielectric which produce a contact (creepage path) between the electrodes. It would also be useful to decrease the number of process steps to reduce the fabrication cost.

BRIEF DESCRIPTION OF THE DRAWINGS

The present invention is illustrated by way of example and not limited to the accompanying figures in which like references indicate similar elements. Exemplary embodiments will be explained in the following text with reference to the attached drawings, in which:

FIG. 1 shows an integrated circuit arrangement with capacitor and with precision resistor, and FIGS. 2 to 4 show fabrication stages in the fabrication of the integrated circuit arrangement.

Skilled artisans appreciate that elements in the figures are illustrated for simplicity and clarity and have not necessarily been drawn to scale.

DETAILED DESCRIPTION

An integrated circuit containing a capacitor and fabrication method is disclosed. The capacitor contains a base and covering electrode with a dielectric therebetween. The dielectric contains an oxide of a material contained in the base electrode, which may be produced by anodic oxidation. A peripheral edge of the dielectric is uncovered by the covering electrode. A base layer on the capacitor includes a cutout adjacent to the dielectric. During fabrication, the base layer protects the material of the base electrode that is to be anodically oxidized from chemicals, and also protects the surrounding regions from anodic oxidation. A precision resistor may be fabricated simultaneously with the capacitor.

In one embodiment, at least one electrode of the capacitor contains a valve metal. A valve metal relates to a metal into which material penetrates and from which no material emerges during anodic oxidation. Valve metals which are suitable for anodic oxidation include for example tantalum, titanium, niobium, zirconium or hafnium. Alternatively, a valve metal nitride such as tantalum nitride may be used. Tantalum nitride has a very low temperature coefficient, and consequently it is also possible for precision resistors which are arranged in the same integrated circuit as the capacitor to be produced from the base electrode layer and/or covering electrode layer. In one configuration, the tantalum and the nitride are present in a stoichiometric ratio. Alternatively, tantalum and nitrogen are in a nonstoichiometric ratio in the valve metal alloy. Tantalum silicide has similarly good electrical properties to tantalum nitride. Therefore, valve metal silicides may also be used. The valve metal and the silicide may be in a stoichiometric ratio or in a nonstoichiometric ratio.

The valve metals react with a large number of chemical substances which are used in the fabrication of integrated circuits, for example with the liquid or solid material of a resist layer, in particular a photoresist, or with liquids which are used to develop a resist layer. Furthermore, if the surface of the valve metal has not yet reacted with resist or developer, a high quality capacitor dielectric, i.e. a dielectric with low leakage currents, can be grown.

In an embodiment, anodic oxidation may be used to form the oxide in the dielectric. In this case, a photolithographically patterned resist is restricted to a part of a base electrode layer from which the base electrode is subsequently produced. The base layer which adjoins the base electrode is used in the fabrication of the integrated circuit. Consequently, resist which is used to define the region for the growth does not directly reach the valve metal alloy, but rather is located on the base layer, which functions as a protective layer. Thus, neither liquid resist nor developer for developing the resist reaches the metal of the base electrode. The cutout is produced using the developed resist, with the base layer having been removed in the region of the cutout, so that the base electrode layer is uncovered in the region of the cutout. Then, the dielectric is grown in the cutout so as to form a dielectric which fills the cutout and is therefore adjacent to the base layer at the edges of the cutout. The dielectric is directly adjacent to the base electrode. The dielectric is usually also directly adjacent to the covering electrode.

The integrated circuit may also include a dielectric layer which is arranged on the base layer and on the covering electrode and may be deposited after the patterning of the covering electrode and after the removal of the residues of a resist layer used to produce the covering electrode. The dielectric layer may contain the same material as the base layer if the dielectric layer is also being used as a protective layer or as an etching stop layer. The dielectric layer contains a different material than the base layer if no further protective layer or etching stop layer is used. If no further protective layer or etching stop layer is used, an intralayer dielectric is a suitable material for the dielectric layer (e.g. an oxide such as silicon dioxide). A nitride such as silicon nitride is suitable as material for the base layer or for a dielectric layer used as protective layer and/or as etching stop layer.

The base layer may be thinner than the dielectric. The dielectric is stepped at its edge, with a step face that lies parallel to the base electrode preferably lying in one plane with the edge of the cutout that is remote from the base electrode. This ensures that the covering electrode has been completely patterned. On the other hand, it also ensures that the dielectric has not been completely patterned simultaneously with the covering electrode. In particular, with this procedure it is possible to avoid polymers on the sides of the dielectric which, by including electrically conductive compounds, would produce a contact or a creepage path between the base electrode and the covering electrode.

In another embodiment, the growth process and therefore the capacitor dielectric thickness can be controlled and set very accurately by setting voltage and current values during anodic oxidation. One suitable dielectric, tantalum pentoxide $Ta_2O_5$, may be formed using anodic oxidation. Tantalum pentoxide has a high dielectric constant which is significantly greater than 7, i.e. than capacitors using silicon nitride which are currently customary.

The covering electrode may have a different material composition than the base electrode. When selecting the material for the electrode level which is not used as precision resistor, it is possible to employ materials with a very high conductivity which, however, for example have a higher temperature coefficient than the material of the other electrode level. The base electrode may be arranged outside a metallization layer which includes interconnects, i.e. in particular in a via level, in which there is more space for the capacitor than in an interconnect level. In an interconnect, current is also transported parallel to a main face of a substrate of the integrated circuit arrangement in which a plurality of integrated semiconductor components are arranged. The semiconductor substrate is, for example, a silicon substrate. By contrast, a via conducts the current in the normal direction or opposite to the normal direction to the main face of the substrate.

A metallization layer, which is adjacent to the base electrode and is arranged out of that side of the base electrode which faces away from the dielectric, includes interconnects containing copper or a copper alloy. Alternatively, the metallization layer which is adjacent to the base electrode and is arranged on that side of the base electrode which faces away from the dielectric is a metallization layer which includes interconnects made from aluminum or an aluminum alloy. Alternatively, however, it is also possible to use other materials, for example gold, silver or tungsten, and other application methods. Prior to fabrication of the capacitor, therefore, it is possible to fabricate metallization layers using a single Damascene method or a dual Damascene method. Alternatively, it is also possible for metallic layers to be deposited over the entire surface and then patterned. Irrespective of the material used for the near-substrate metallization layer on which the capacitor has been produced, the capacitor can be connected directly via an interconnect of the metallization layer below, so that the interconnect serves as an electrically conductive terminal for the base electrode.

Alternatively, an insulating layer may be arranged between the base electrode and the interconnect level below, or the region beneath the base electrode is filled with between-interconnect insulating material in the metallization layer below. In this case, the base electrode has to be connected from above, so that the terminal or terminals for connection of the base electrode are arranged on that side of the base electrode which faces the dielectric. In both cases, the covering electrode is connected from above.

A thin-film resistor made from the material of the base electrode or the covering electrode may be simultaneously fabricated with the capacitor. Alternatively, resistors are arranged both in the layer or plane of the base electrode and in the layer or plane of the covering electrode. The resistor may be a precision resistor with a temperature coefficient of less than $10^{-4}$ $K^{-1}$ (1/Kelvin) or $10^{-4\circ}$ $C.^{-1}$ (1/degree Celsius). Precision resistors of particularly high quality may even have temperature coefficients of less than $10^{-5}$/Kelvin. These components can be produced with a small number of process steps as a result of the simultaneous fabrication of precision resistors and base electrodes of capacitors in one plane.

A method for fabricating a capacitor includes: producing an electrically conductive base electrode layer, producing a protective layer after the base electrode layer has been produced, with the base electrode layer still in its unpatterned state, applying a resist layer to the base layer, with the base layer still in its unpatterned state, selectively irradiating and developing the resist layer, patterning the base layer with the developed resist layer, the base electrode layer being uncovered in at least one region in accordance with the developed resist layer, i.e. the base electrode layer is only superficially etched but not completely patterned, carrying out an oxidation of the base electrode layer in at least one uncovered region of the base electrode layer following the patterning of the protective layer.

The base layer prevents the material of the base electrode layer from reacting with chemical substances which are used in the fabrication of the capacitor, in particular with liquid photoresist or with developer for the photoresist, before the production of the dielectric, in particular before the oxidation is carried out. This makes it possible to produce a high-quality oxide. As above, the oxidation may be an anodic oxidation, which is carried out prior to the removal of residues of the resist layer which have remained after the developing. Thus, both the protective layer and the resist restrict the region in which the anodic oxidation is selectively carried out. In one configuration, the base electrode contains a valve metal or a valve metal alloy.

The residues of the resist layer may be removed following the oxidation. After the removal of the residues of the resist layer, the covering electrode layer is produced, for example deposited. The covering electrode layer is patterned using a resist method, uncovering either the base electrode layer or the base layer. If only the base layer is uncovered, i.e. the base electrode layer is not attacked, it is impossible for any polymer bridges to form between the electrodes of the capacitor during etching.

After the patterning of the covering electrode layer a covering electrode protective layer is produced. The covering electrode protective layer in turn protects against creepage and leakage currents and moreover acts as an etching stop layer during the etching of terminals for the base electrode and/or for the covering electrode. The covering electrode protective layer is patterned using a resist method together with the base electrode layer. If the covering electrode protective layer provides a protective action, it prevents liquid photoresist or developer used to develop the photoresist from reaching the sensitive base electrode layer and, for example, prevents terminals which are subsequently produced from having a poor contact with the base electrode layer and/or permits elimination of prior complex cleaning steps for cleaning the contact surfaces.

Turning to the figures, FIG. 1 shows an integrated circuit 10. The integrated circuit 10 includes a substrate (not shown)

and a plurality of layers on the substrate. The substrate may be fabricated from a semiconductor, such as silicon. The layers include a planar contact layer 12, a first silicon nitride layer 14, a first interconnect layer 16, a second silicon nitride layer 18, a via layer 20, a third silicon nitride layer 22, a second interconnect layer 24, and a fourth silicon nitride layer 26. The thicknesses of the planar contact layer 12, a first silicon nitride layer 14, a first interconnect layer 16, a second silicon nitride layer 18, a via layer 20, a third silicon nitride layer 22, a second interconnect layer 24, and a fourth silicon nitride layer 26 are, for example, about: 300 nm, 50 nm, 200 nm, 50 nm, 500 nm, 50 nm, 500 nm, and 50 nm, respectively.

The silicon nitride layers 14, 18, 22 and 26 serve both as etching stop layers and as a diffusion barrier to prevent the diffusion of copper to the substrate.

A plurality of contacts 30, 32 and 34 which lead to the semiconductor substrate or to polycrystalline silicon are arranged in the contact layer 12. In one embodiment, the contacts 30, 32 and 34 comprise tungsten and penetrate through the contact layer 12.

In one embodiment, a plurality of copper interconnects are disposed in the interconnect layer 40. On the side walls and bases of the interconnects there is a diffusion barrier layer or bonding layer (liner layer). The liner layer, for example, comprises tantalum or tantalum nitride. The liner layers may have a thickness of less than about 50 nm. An interconnect 40 which connects the contacts 30 and 32 is illustrated in the interconnect layer 16. The interconnect level 16 contains a conductor structure 42 which connects to the contact 34.

A plurality of vias 50, 52, 54, 56, 60 and 62, which provide vertical current transport, are arranged in the via layer 20. For example, in one embodiment, a first via 50 leads to the interconnect 40 and a second via 52 leads to the conductor structure 42. The vias 50 and 52 penetrate the via layer 20. Two other vias 54 and 56 form the terminals for a precision resistor 57. The precision resistor 57 is covered by a base layer portion 58 and a protective layer portion 59. Both the base layer portion and the protective layer portion 58 and 59 contain, for example, silicon nitride.

Two other vias 60 and 62 connect to a capacitor 64. The capacitor 64 includes a near-substrate base electrode 66, a dielectric 68, and a covering electrode 70. The capacitor 64 may be, for example, a MIM capacitor (metal-insulator-metal capacitor). In the embodiment shown in FIG. 1, the base electrode 66 contains tantalum nitride, the dielectric 68 contains tantalum oxide, and the covering electrode 70 contains tantalum. The base electrode has a thickness of, for example, less than about 100 nm, e.g. a thickness of about 80 nm. The dielectric 68 has a thickness of, for example, about 50 nm. The covering electrode 70 has a thickness of, for example, about 30 nm. The via 60 connects to the covering electrode 70. By contrast, the via 62 connects to the base electrode 66. The capacitor 64 is likewise covered by a base layer portion 71 and a protective layer portion 72. Both portions 71 and 72 contain, for example, silicon nitride.

The precision resistor 57 and the capacitor 64 are separated from one another by insulating material of the via layer 20, for example by silicon dioxide. Between the precision resistor 57 and the silicon nitride layer 18 and between the capacitor 64 and the silicon nitride layer 18 there is a thin insulation layer 100, for example of silicon dioxide. This insulation layer 100 has a thickness of, for example, less than about 100 nm, for example of about 50 nm. On their side walls and their bases, the vias 50 to 56, 60 and 62 are covered with a barrier or bonding layer, for example a tantalum nitride liner.

A plurality of interconnects for lateral current transport and a plurality of conductor structures 80 to 90, which conduct current vertically and laterally, are arranged in the interconnect layer 24. The conductor structure 80 connects to the via 50. The conductor structure 82 connects to the via 52. The conductor structures 84 and 86 connects to the via 54 and the via 56, respectively, i.e. for the precision resistor 57. By contrast, the conductor structures 88 and 90 connects to the via 60 and 62, respectively, and thus for the capacitor 64. The conductor structures 80 to 90 penetrate through the interconnect layer 24 and the silicon nitride layer 22. A barrier or bonding layer is arranged on the side walls of the conductor structures 80 to 90. A barrier or bonding layer is also arranged on the bases of the conductor structures 80 to 90 in regions at which there is no overlap with vias 52 to 62.

In the embodiment shown, the interconnects 40, 42, the vias 50 to 56, 60 and 62 and the conductor structures 80 to 90 contain copper or a copper alloy. Alternatively, it is also possible to use other conductive materials, for example aluminum, tungsten, gold or silver and/or alloys thereof. Silicon dioxide is used as insulation material in the contact layer 12, in the interconnect layer 16, in the via layer 20, and in the interconnect layer 24. Alternatively, a material with a lower dielectric constant than silicon dioxide, i.e. a low-k material, is used. In particular, if material with a low dielectric constant is used, it is also possible for silicon carbide or a material which contains silicon, carbon, and nitrogen to be used instead of the silicon nitride layers 14, 18, 22, and 24.

The fabrication of the circuit arrangement 10 is explained in more detail below with reference to FIGS. 2 to 4. The contact layer 12, the silicon nitride layer 14, the interconnect layer 16, and the silicon nitride layer 18 are produced in a manner known to one of skill in the art and consequently the associated process steps are not explained in more detail. After the silicon nitride layer 18 has been deposited over the entire surface, for example using a CVD (chemical vapor deposition) process, a thin silicon dioxide layer 100, which defines the distance between the precision resistor 57 and/or the capacitor 54 and the silicon nitride layer 18 and therefore ultimately also the substrate, is deposited over the entire surface. By way of example, the silicon dioxide layer 100 is produced using a CVD process. After the silicon dioxide layer 100 has been deposited, a tantalum nitride layer 102 is deposited over the entire surface, for example by sputtering and for example in a thickness of about 80 nm. Alternatively, it is possible to deposit a tantalum layer or a layer of a different oxidizable material.

After the tantalum nitride layer 102 has been deposited over the entire surface, a base layer 104 is deposited. The base layer 104 protects the tantalum nitride layer 102 from photoresist and developer, as explained in more detail below. The base layer 104 is, for example, silicon nitride with a thickness of about 50 nm (nanometers).

A photoresist layer 106 is applied to the entire surface of the as yet unpatterned silicon nitride base layer 104, for example by spin-on. The photoresist layer 106 is selectively exposed and developed, with a cutout 108 being formed at the location at which the dielectric 68 is to be produced. The cutout 108 has a base on the silicon nitride base layer 104 following the developing. The base layer 104 has not yet been patterned following the developing.

Then, the silicon nitride base layer 104 at the base of the cutout 108 is removed, for example using a plasma etching process, so as to uncover a region B of the tantalum nitride layer 102. The contact region of the electrode terminals at the edge of the wafer also is uncovered for the anodic oxidation.

Then, an anodic oxidation of the tantalum nitride layer 102 to produce the dielectric 68 is carried out selectively only in the cutout 108. The positive pole of a DC voltage is connected to the positive pole of a DC voltage source at the edge of the integrated circuit or a wafer which includes the integrated circuit 10, for example using a sealed contact. The sealing protects the contact region from the anodic oxidation of the edge region. The negative pole of the DC voltage source is connected via a line to a tantalum electrode or to a tantalum nitride electrode. The electrodes may also contain platinum or another material. The electrode and the circuit arrangement 10 are immersed in a tank which contains a suitable electrolyte solution, for example phosphoric acid or citric acid. In the cutout 108, the dielectric 68 is grown, for example by application of a constant current until a defined maximum voltage is present. This corresponds to the defined dielectric target layer thickness. In the subsequent annealing phase, the voltage is kept constant at this maximum value. In this phase, the current flow decreases continuously and only anneals the layer and closes diffusion paths that are still present. Substantially no further dielectric layer thickness increase takes place in this phase.

The thickness of the dielectric is determined by the maximum voltage, which is, for example, about 100 volts. By way of example, it takes half an hour for the maximum voltage to be reached from the start of anodic oxidation.

After the oxidation of the dielectric 68, the integrated circuit 10 is removed from the tank. The electrical terminal in the edge region of the wafer or the circuit is removed again. Then, the residues of the photoresist layer 106 which have remained after developing are removed.

As illustrated in FIG. 3, a covering electrode layer 120, which in the embodiment contains tantalum, is then deposited. In other embodiments, titanium, aluminum, tantalum nitride or titanium nitride is used as material for the covering electrode layer 120.

A photoresist layer 122 is applied to the as yet unpatterned covering electrode layer 120 and is selectively exposed and developed, with a rectangular or square resist structure 124 remaining above the region B. The dimensions of the resist structure 124 are such that the region B is not completely covered. For example, there may be a surrounding edge D of, for example, about 100 nm which is not covered by the resist structure 124.

Then, the covering electrode layer 120 is patterned in accordance with the resist structure 124, for example using plasma etching. During the plasma etching, a step is formed in the edge region of the dielectric 68 on account of the etching being stopped in the silicon nitride base layer 104. In the embodiment, the dielectric 68 projects beyond the portion of the surface of the silicon nitride base layer 104 which is remote from the substrate even before the reactive ion etching. By way of example, half the layer thickness of the silicon nitride base layer 104 is removed. Accordingly, the tantalum nitride layer 102 arranged beneath the silicon nitride base layer 104 is not uncovered during the patterning of the covering electrode layer 120, so that the formation of polymer bridges between the electrodes of the capacitor 64 is avoided. If these polymers contain metal inclusions, short-circuits or tracking currents would be formed.

As illustrated in FIG. 4, following the patterning of the covering electrode 70 and the removal of the resist structure 124, a covering electrode protective layer 126 is deposited, for example using a CVD process. The protective layer 126 contains, for example, silicon nitride.

A photoresist layer 130 is applied to the as yet unpatterned protective layer 126, and is selectively exposed and patterned, producing inter alia two photoresist structures 132 and 134. The photoresist structure 132 is located above the region B and projects beyond the region B at a peripheral edge by a distance A of, for example, about 400 nm. At at least one side, the edge is to be defined such that the via 62 can be placed in the projecting region.

In the embodiment, the photoresist structure 134 is located on the left-hand side of the photoresist structure 132 and defines a region in which the precision resistor 57 is to be produced.

As can also be seen from FIG. 1, the precision resistor 57 and the base electrode 66 are then patterned in accordance with the photoresist structures 132 and 134, for example using a plasma etching process. This etching stops at the silicon dioxide layer 100. The precision resistor 57 and the base electrode 66 of the capacitor 64 are formed from the tantalum nitride layer 102. The base layer portions 58 and 71 are formed from the silicon nitride protective layer 102, which has already been thinned and pre-patterned with the cutout 108. The protective layer portions 59 and 72 are formed from the protective layer 126 which was patterned during the base electrode etch.

Then, the silicon dioxide of the via layer 20 is applied, for example using a plasma CVD process. The silicon dioxide of the via layer 20 can be planarized, for example using a CMP (chemical mechanical polishing) method. Then, the silicon nitride layer 22 is deposited. After that, a silicon dioxide layer which forms the insulation of the interconnect layer 24 is deposited. Next, the vias 50 to 56, 60 and 62 and the conductor structures 80 to 90 are produced in a dual Damascene process. By way of example, after cutouts have been opened up in the via layer 20 and in the interconnect layer 24 and after the liner has been sputtered on, a thin copper layer is sputtered on. Then, the copper cores of the vias 50 to 56 and 60, 62 and of the conductor structures 80 to 90 are produced using an electroplating process.

This is followed by planarization, for example using a CMP method. Then, the silicon nitride layer 26 is deposited and further metallization layers are produced. In other embodiments, the interconnect layer 24 is the outer metallization layer, with the result that external terminals are applied to the circuit arrangement 10 following the production of the interconnect layer 24.

In another embodiment, the method is carried out with a metallization, for example of aluminum, produced by reactive ion etching. During the production of the precision resistor 57 and of the MIM capacitor 64, the aluminum conductor structures are covered with an oxide, and the insulation between the aluminum conductor structures is planarized.

In another embodiment, the base layer 104 is completely removed during the patterning of the covering electrode 70. This involves stopping, for example, at the tantalum nitride layer 102. In another embodiment, the resist structure 124 projects a predetermined distance beyond the region B at its periphery. In another embodiment, the tantalum nitride layer 102 is deposited in cutouts in the silicon nitride layer 18, so that the base electrode 66 of the capacitor can also be connected from below. In another embodiment, the photoresist layer 106 is removed as early as after patterning of the base layer 104, prior to the anodic oxidation.

In the method explained, the precision resistor 57 and the capacitor 64 are produced simultaneously, i.e. using a plurality of process steps in which parts of the precision resistor 57 and/or the capacitor 64 are produced simultaneously. This procedure results in numerous advantages. For example, both passive components can be produced with a significantly reduced number of photoplanes and process steps. Compared to a variant in which the passive components are arranged in different levels, it is possible to save one oxide layer and one CMP planarization used to planarize this oxide layer, thereby considerably reducing the fabrication outlay. On account of a current-driven or voltage-driven diffusion reaction which is simple to control during the anodic oxidation, the dielectric 68 has a high quality with a higher dielectric constant and a higher breakdown voltage than deposited dielectrics. The layer quality can be monitored and controlled in a very wide range by means of the current profile and/or by means of the voltage profile during the anodic oxidation. The anodic oxidation of the dielectric 68 can also be carried out independently of the fabrication of a precision resistor 57, i.e. in a circuit arrangement which does not include any precision resistors 57. A very simple, faster and inexpensive process is achieved compared to tantalum oxide deposition operations. The fabrication of the precision resistor 57 can be maintained in various levels compared to the fabrication of precision resistor and capacitor. If an anodic oxidation is used, self-annealing of defects in the dielectric 68 occurs, since an additional oxide grows at conducting locations, for example tantalum nitride peaks are converted into oxide during the growth of the dielectric 68.

Therefore, by using a selective anodic oxidation of the capacitor dielectric, it is possible to produce a very high-quality capacitor 64 and therefore a very high-quality integrated circuit arrangement 10. The tantalum nitride layer 102 can be used simultaneously as precision resistor 57 and as base electrode 66 of the capacitor 64 and, in anodically oxidized form, as dielectric.

It is therefore intended that the foregoing detailed description be regarded as illustrative rather than limiting, and that it be understood that it is the following claims, including all equivalents, that are intended to define the spirit and scope of this invention. Nor is anything in the foregoing description intended to disavow scope of the invention as claimed or any equivalents thereof.

We claim:
1. A method for fabricating a capacitor, comprising:
   providing a base electrode layer;
   forming a base layer over the base electrode layer;
   patterning the base layer to uncover a region of the base electrode layer;
   carrying out an anodic oxidation of the base electrode layer in the uncovered region of the base electrode layer to form a dielectric;
   forming a covering electrode layer over the dielectric; and
   patterning the covering electrode layer to uncover a peripheral edge of the dielectric, wherein the base electrode layer has a cutout adjacent to the dielectric arranged on a side of the base electrode layer which faces the dielectric, and the dielectric is stepped at an edge, with a step face that lies parallel to the base electrode layer lying in one plane with an edge of the cutout that is remote from the base electrode layer.
2. The method of claim 1, wherein the base electrode layer comprises a valve metal, a valve metal nitride, or a valve metal silicide of the metals Ta, Ti, Nb, Zr, or Hf.
3. A method for fabricating a capacitor, comprising:
   providing a base electrode layer;
   forming a base layer over the base electrode layer;
   patterning the base layer to uncover a region of the base electrode layer; and
   carrying out an anodic oxidation of the base electrode layer in the uncovered region of the base electrode layer to form a dielectric, the base layer being thinner than the dielectric.
4. The method of claim 3, wherein the base electrode layer comprises a valve metal, a valve metal nitride, or a valve metal silicide of the metals Ta, Ti, Nb, Zr, or Hf.

\* \* \* \* \*